US007071083B2

(12) United States Patent
Lin

(10) Patent No.: US 7,071,083 B2
(45) Date of Patent: *Jul. 4, 2006

(54) METHOD OF FABRICATING POLYSILICON FILM BY EXCIMER LASER CRYSTALLIZATION PROCESS

(75) Inventor: Kun-chih Lin, Hsin-Chu Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/604,687

(22) Filed: Aug. 11, 2003

(65) Prior Publication Data

US 2004/0235276 A1    Nov. 25, 2004

(30) Foreign Application Priority Data

May 2, 2003    (TW) ............................... 92112077 A

(51) Int. Cl.
*H01L 21/36*    (2006.01)
*H01L 21/20*    (2006.01)

(52) U.S. Cl. ...................... 438/487; 439/486; 439/482; 439/166

(58) Field of Classification Search ................ 438/166, 438/482, 486, 487, 488
See application file for complete search history.

(56) References Cited

U.S. PATENT DOCUMENTS

| 5,308,998 | A | * | 5/1994 | Yamazaki et al. | ............. | 257/57 |
| 5,365,080 | A | * | 11/1994 | Yamazaki et al. | ............. | 257/66 |
| 5,581,092 | A | * | 12/1996 | Takemura | .................... | 257/65 |
| 5,648,662 | A | * | 7/1997 | Zhang et al. | ................. | 257/59 |
| 5,693,541 | A | * | 12/1997 | Yamazaki et al. | .......... | 438/486 |
| 5,705,413 | A | * | 1/1998 | Harkin et al. | ............... | 438/155 |
| 6,001,714 | A | * | 12/1999 | Nakajima et al. | ........... | 438/525 |
| 6,118,139 | A | * | 9/2000 | Yuda | ........................... | 257/59 |
| 6,197,623 | B1 | * | 3/2001 | Joo et al. | ..................... | 438/151 |
| 6,426,245 | B1 | * | 7/2002 | Kawasaki et al. | .......... | 438/166 |

FOREIGN PATENT DOCUMENTS

JP    60191088    9/1985

* cited by examiner

*Primary Examiner*—Maria F. Guerrero
(74) *Attorney, Agent, or Firm*—Winston Hsu

(57) ABSTRACT

A method of fabricating a polysilicon film by an excimer laser crystallization process. First, a substrate comprising a first region and a second region is provided. An amorphous silicon layer and a mask layer are formed on the substrate in sequence. Then, a photo-etching process is performed to remove the mask layer in the first region. A heat-retaining capping layer is formed on the mask layer and the amorphous silicon layer. After that, an excimer laser crystallization process is performed so that the amorphous silicon layer in the first region is crystallized into a polysilicon film.

24 Claims, 8 Drawing Sheets

METHOD OF FABRICATING POLYSILICON FILM BY EXCIMER LASER CRYSTALLIZATION PROCESS

BACKGROUND OF INVENTION

1. Field of the Invention

The present invention relates to a method of fabricating a polysilicon film, and more particularly, to a method of fabricating a polysilicon film by an excimer laser crystallization(ELC) process.

2. Description of the Prior Art

The progress of science and technology has led to small, effective, and portable intelligent information products becoming a part of our lives. Display devices play an important role because all intelligent information products, such as mobile phones, personal digital assistants (PDAs), or notebooks, need display devices to be a communication interface. However, the fully developed amorphous silicon thin film transistor liquid crystal display (a-Si TFT LCD) devices, which are restricted in their carrier transfer rate, have difficulty in meeting the requirements of being thin, being power saving, and having high resolution. Therefore, the a-Si TFT LCD devices are gradually replaced by low temperature polysilicon (LTPS) thin film transistor liquid crystal display (TFT LCD) devices.

In the liquid crystal display devices, since a normal glass substrate can only work at a temperature below 600° C., fabricating a polysilicon film directly under a high temperature will make the glass substrate twisted. Thus, in a conventional method of fabricating a polysilicon thin film transistor, an expensive quartz substrate is needed and only a small size liquid crystal display panel can be made. Recently, a method of forming a low temperature polysilicon film by crystallizing an amorphous silicon film is gradually developed. Among the methods of forming polysilicon film, the excimer laser crystallization process is the major focus.

The excimer laser crystallization process is typically divided into two types, which are a conventional scanning ELC process and an ELC process with a location-controlled grain boundary. Please refer to FIG. 1, which is a schematic diagram of a conventional scanning ELC process. As shown in FIG. 1, a buffer layer 12 and an amorphous silicon film 14 are deposited on a glass substrate 10 in sequence. Then, the glass substrate 10 is put on a carrying stage, which moves step by step along an X direction. In addition, the excimer laser L scans the whole surface of the amorphous silicon film 14 step by step and heats the amorphous silicon film 14 rapidly, thereby making the amorphous silicon film 14 melted and crystallize to a polysilicon film 16 thereafter. Though this method is very simple, the location of the grain boundary cannot be controlled so as to restrict the transfer rate of electronics and the performance of devices.

Please refer to FIG. 2 and FIG. 3, which are schematic diagrams of an ELC process with a location-controlled grain boundary. As shown in FIG. 2 and FIG. 3, in this method, a buffer layer 22 and an amorphous silicon film 24 are also formed on a substrate 20 at first. The amorphous silicon film 24 is defined with a first region 26 and a second region 28 in the surface of the amorphous silicon film 24. Then, a patterned mask layer 30 is formed to cover on the second region 28. Normally, the mask layer 30 comprises a metal layer, which can increase the reflection rate to reduce the heat absorption of the amorphous silicon film 24, or a silicon nitride layer, which can increase the thermal conductivity to increase the heat dissipation of the amorphous silicon film 24. As a result, this makes the amorphous silicon 24 in the second region 28, which is covered with a mask layer 30, partially melted and the amorphous silicon film 24, which is not covered with the mask layer 30, fully melted. Consequently, when the melted amorphous silicon film 24 solidifies after the excimer laser irradiation is finished, a nucleation will happen based on the partially melted region since there is a heterogeneous interface between the partially melted region and the completely melted region. Grains are grown laterally from the second region 28, which is partially melted, to the first region 26, which is completely melted, to form a polysilicon film in the first region 26. Then, a photo-etching process is performed to remove the mask layer 30 and the amorphous silicon film 24 in the second region and form a polysilicon island 32 in the first region 26. After that, latter processes of liquid crystal panel manufacturing are performed while the polysilicon island 32 is used as an active area to form a driving circuit of the liquid crystal display panel.

In the aforementioned excimer laser crystallization process with a location-controlled grain boundary, though the location of the grain boundary can be controlled, the produced grain size is only about 3 μm due to a limitation of the room temperature. In addition, the use the metal layer on a conductor directly easily pollutes the active area of devices, and the use of the silicon nitride layer often makes a phenomenon of semiconductor film peeled due to the high concentration of hydrogen atoms contained therein. Thus, there is a strong need to develop a fabricating method of the polysilicon film to increase the grain size in the polysilicon film.

SUMMARY OF INVENTION

It is therefore a primary objective of the claimed invention to provide a method of fabricating a polysilicon film by an excimer laser crystallization process which comprises a step of forming a heat-retaining capping layer so as to increase the grain size of the polysilicon film and improve the performance of devices.

In a preferred embodiment, the claimed invention provides a method of fabricating a polysilicon film by an excimer laser crystallization process. First, a substrate comprising a first region and a second region is provided. An amorphous silicon layer and a mask layer are formed on the substrate in sequence. Then, a photo-etching process is performed to remove the mask layer in the first region. A heat-retaining capping layer is formed on the mask layer and the amorphous silicon layer. After that, an excimer laser crystallization process is performed so that the amorphous silicon layer in the first region is crystallized into a polysilicon film.

It is an advantage of the claimed invention that the method not only forms a mask layer to control the location of grain boundary but also utilizes a heat-retaining capping layer to maintain the temperature of the amorphous silicon film so as to increase the grain size. As a result, the electric performance of the low temperature polysilicon thin film transistor is improved effectively and the display quality of the display device is also improved.

These and other objectives of the claimed invention will no doubt become obvious to those of ordinary skill in the art after reading the following detailed description of the preferred embodiment which is illustrated in the various figures and drawings.

DETAILED DESCRIPTION

Figure 1:
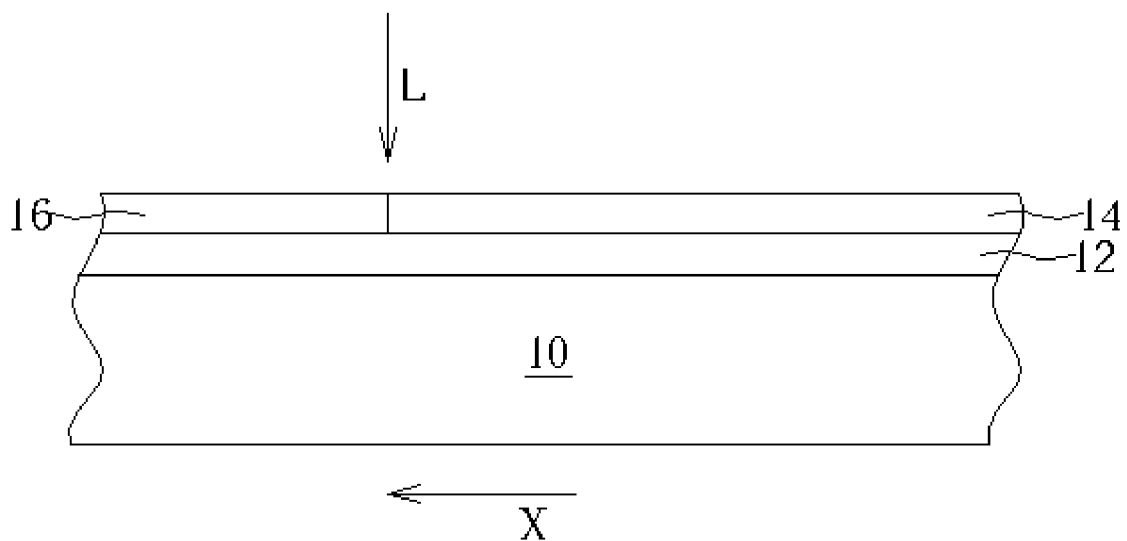
FIG. 1 is a schematic diagram of a conventional method of fabricating a polysilicon film by an excimer laser crystallization process.
Figure 2:
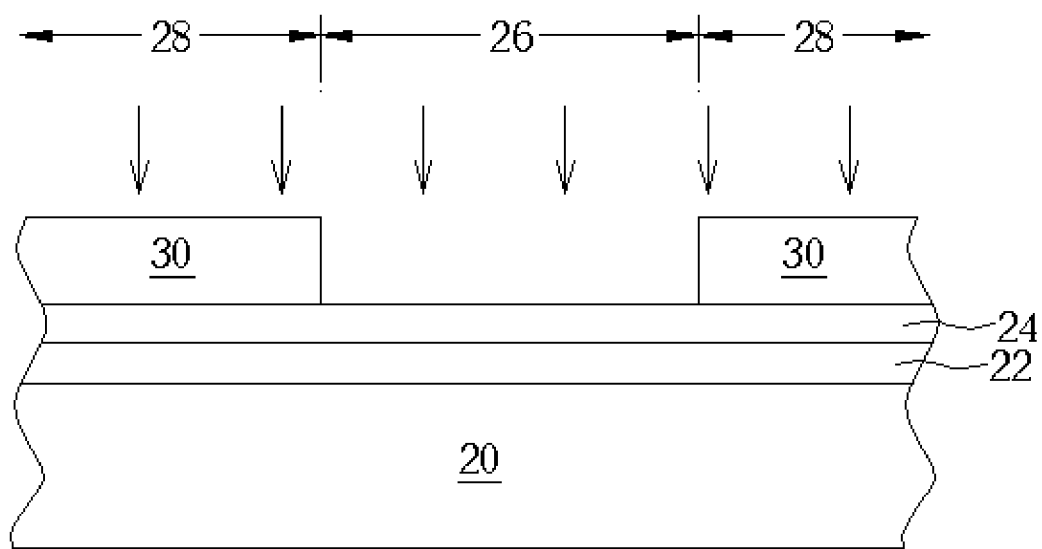
FIG. 2 and FIG. 3 are schematic diagrams of another conventional method of fabricating a polysilicon film by an excimer laser crystallization process.
Figure 3:
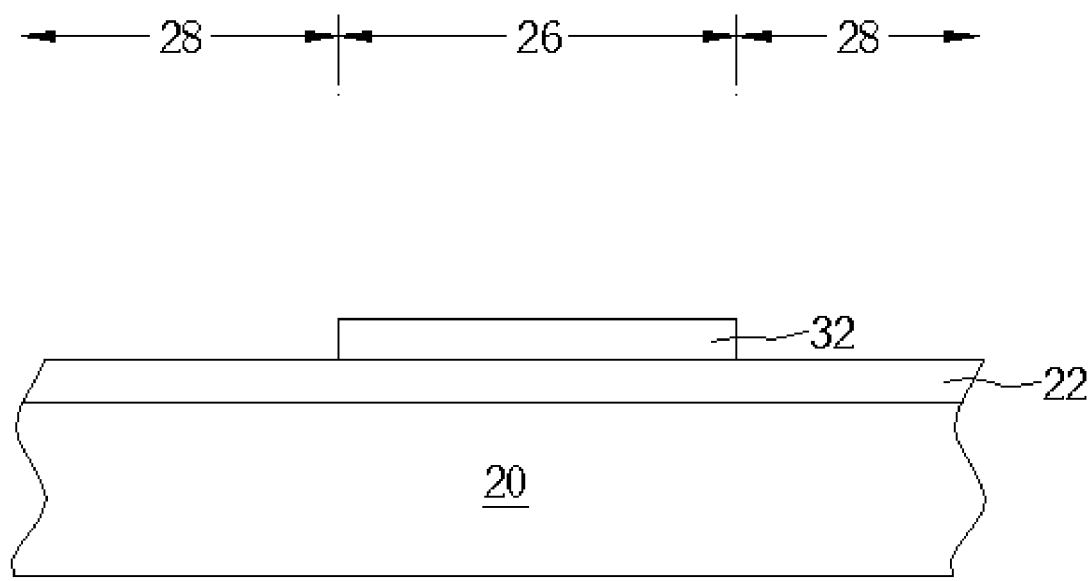
Figure 4:
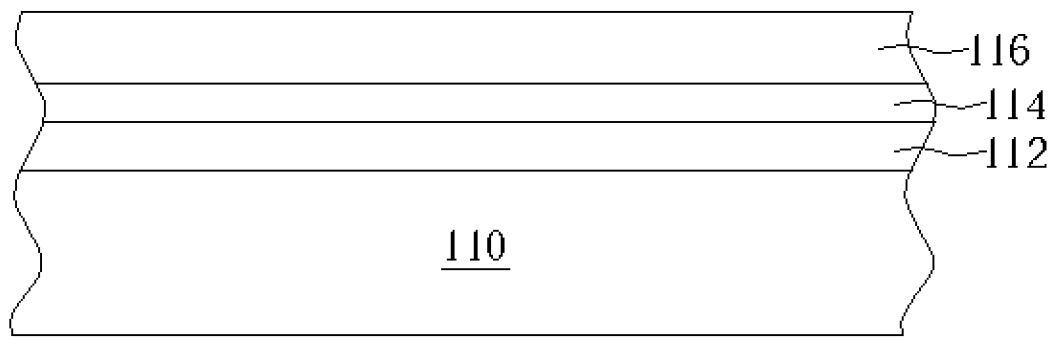
FIG. 4 to FIG. 7 are schematic diagrams of a method of fabricating a polysilicon film by an excimer laser crystallization process according to a first embodiment of the present invention.

Please refer to FIG. 4 to FIG. 7, which are schematic diagrams of a method of fabricating a polysilicon film by an excimer laser crystallization process according to a first embodiment of the present invention. As shown in FIG. 4, a substrate 110 is first provided. The substrate 110 is defined with a first region 120 and a second region 130. Then, a buffer layer 112 is formed on the substrate 110 to prevent the impure materials from diffusing upward in latter processes and affecting the quality of the polysilicon film. After that, an amorphous silicon film 114 is formed on the buffer layer 112 and a mask layer 116 is formed on the amorphous silicon film 114. In the preferred embodiment of the present invention, the substrate 110 is a glass substrate. The buffer layer 112 is a silicon oxide layer or a multi-layer structure composed of a silicon oxide layer and a silicon nitride layer. The mask layer 116 is a single layer structure composed of a silicon oxide layer, a silicon nitride layer, a metal layer, or a silicon oxy-nitride layer or a multi-layer stacked structure composed of aforementioned materials. The methods of forming the layers mentioned above are various, such as a low temperature chemical vapor deposition (LPCVD) process, plasma enhanced chemical vapor deposition (PECVD) process, or sputtering process. The methods are not described in detail since they are standard processes for this field.

Figure 5:
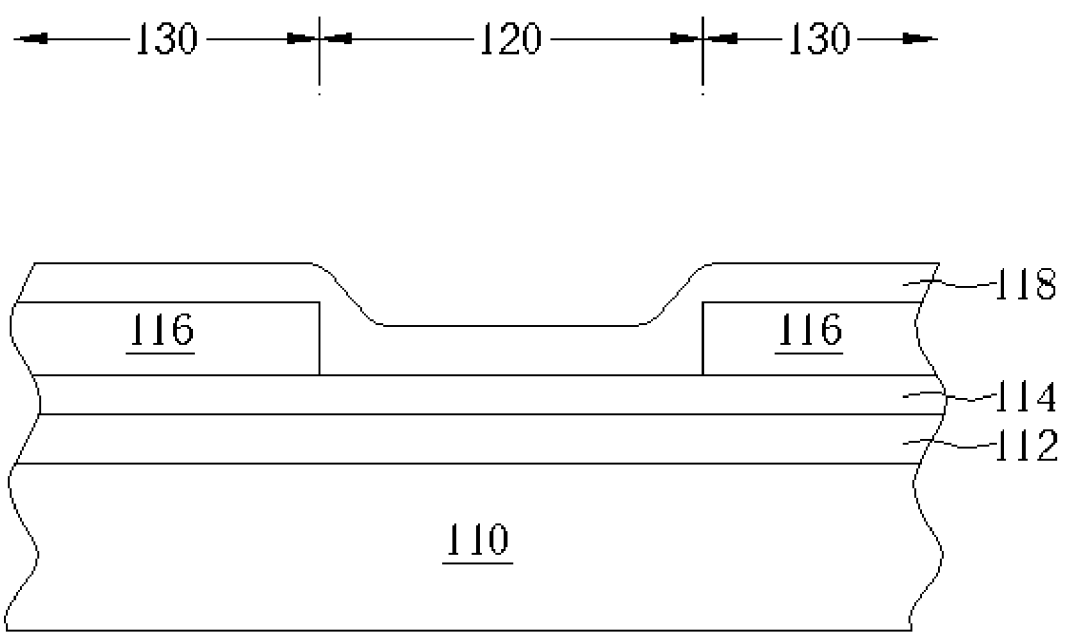

As shown in FIG. 5, a first photo-etching process is performed to remove the mask layer 116 in the first region to expose the amorphous silicon film 114 in the first region. Then, a chemical vapor deposition process is performed to form a heat-retaining capping layer covering on the mask layer 116. In the preferred embodiment of the present invention, the heat-retaining capping layer comprises a silicon oxide layer, a silicon nitride layer, or a silicon oxy-nitride layer.

Figure 6:
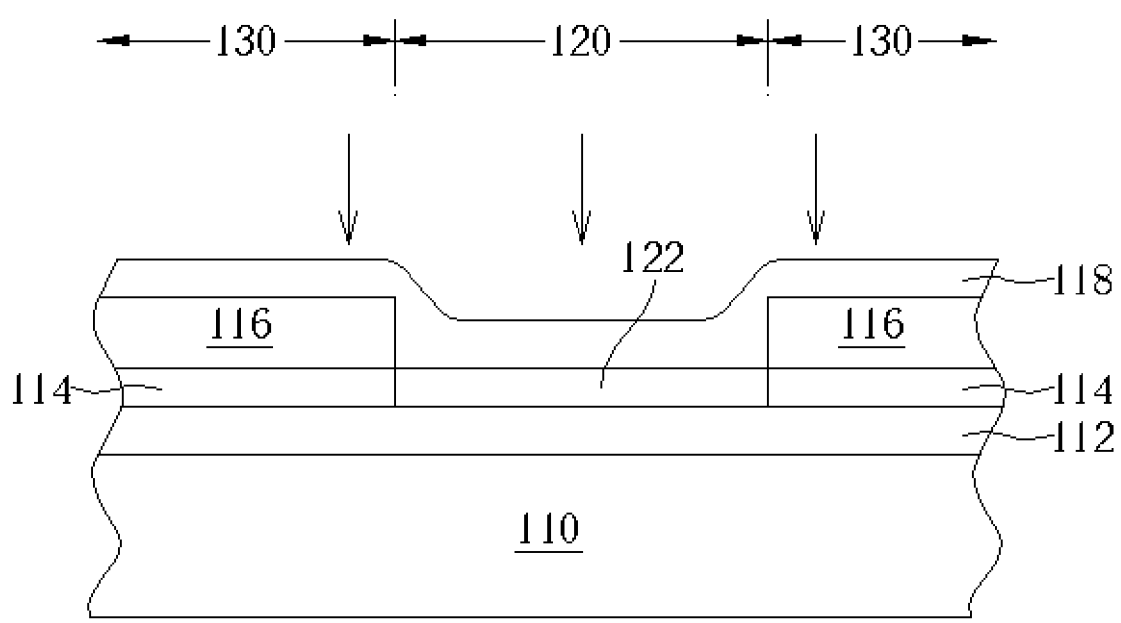

As shown in FIG. 6, an excimer laser irradiation is performed. No matter if a metal layer, which can increase the reflecting rate, or a material with a high thermal conductivity, which can increase the heat dissipation rate, is used in the mask layer 116, this makes the amorphous silicon film 114 in the first region 120 completely melted and the amorphous silicon film 114 in the second region 130 not melted or partially melted. After that, the excimer laser irradiation is stopped so as to make the melted amorphous silicon film 114 crystallize to a polysilicon film 122. The heat dissipation rate is reduced in the crystallization process due to the existence of the heat-retaining capping layer 118. As a result, comparing with the conventional method, the amorphous silicon film 114 can be maintained in a higher temperature environment for more time to perform the crystallization, leading to increase the grain size effectively.

Normally, the excimer laser is generated from the molecules such as XeCl, ArF, KrF, or XeF. Different molecules produce excimer lasers with different wavelengths. The output power of the excimer laser and the irradiating time can be adjusted according to the thickness of the amorphous silicon film 114. The process parameters are not described in detail since those process parameters can be easily obtained by one skilled in the art. It is noted that the excimer laser used in the present invention is not limited to a conventional short pulse duration laser, which has a period in as range of 20 to 50 ns, but can use a long pulse duration laser, which has a period in a range of 150 to 250 ns, for increasing the grain size in advance.

Figure 7:
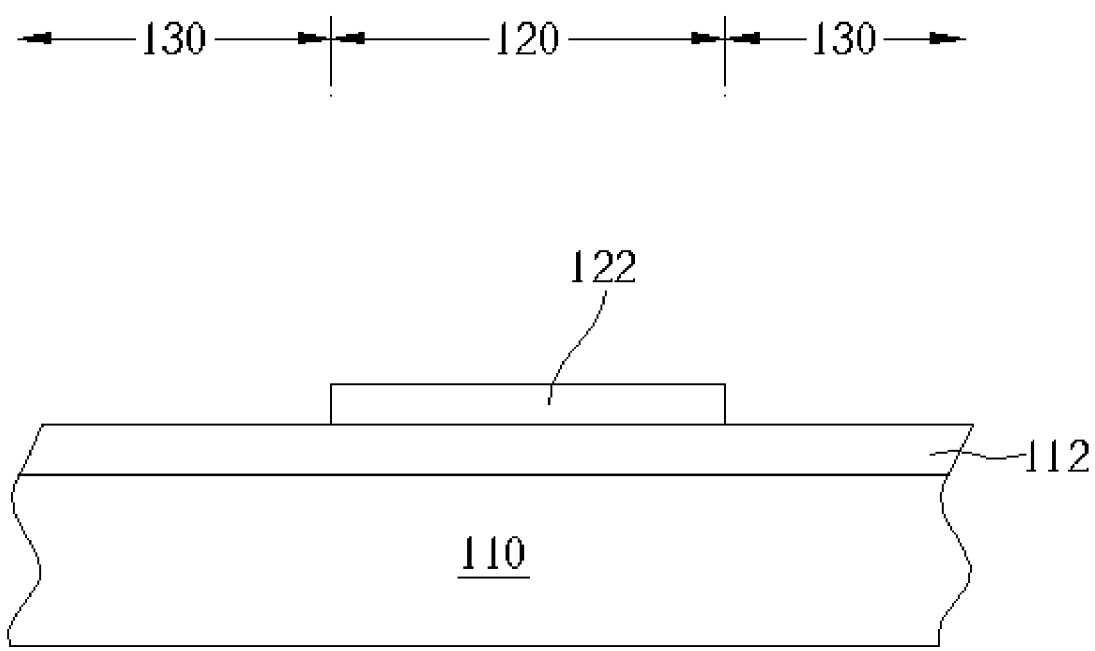

As shown in FIG. 7, a second photo-etching process is then performed to remove the heat-retaining capping layer 118, the mask layer 122, and the amorphous silicon film 114 in the second region 130. An etching process is then followed to remove the heat-retaining capping layer 118 positioned on the polysilicon film 122 to form a polysilicon island which can be used as an active area of a low temperature polysilicon thin film transistor in latter manufacturing processes of the display panel. The latter processes are not described in detail since those should be obvious for one skilled in that field.

Figure 8:
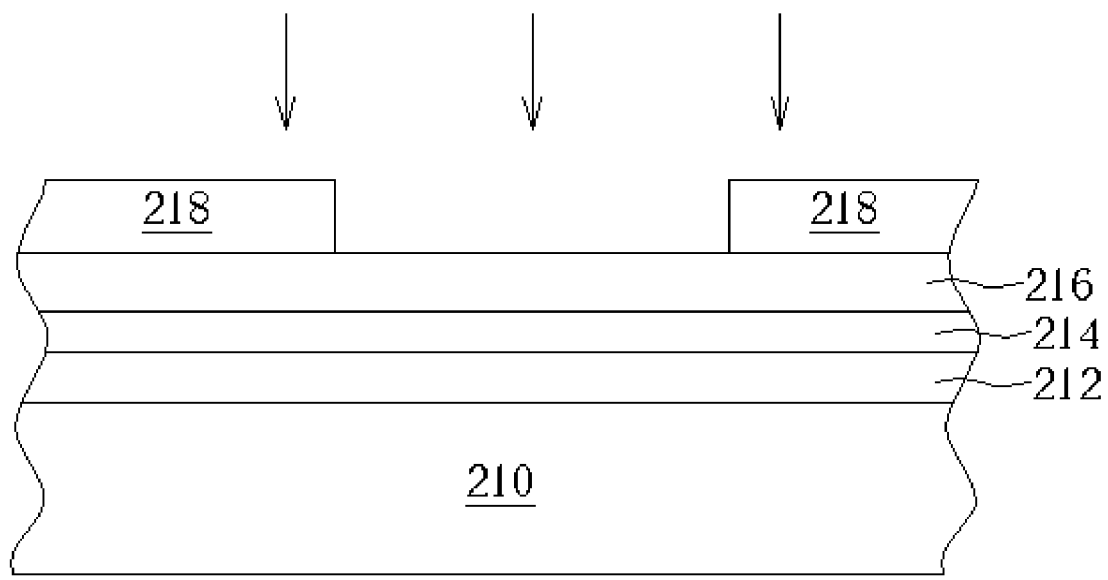
FIG. 8 is a schematic diagram of a method of fabricating a polysilicon film by an excimer laser crystallization process according to a second embodiment of the present invention.

Please refer to FIG. 8, which is a schematic diagram of a method of fabricating a polysilicon film by an excimer laser crystallization process according to a second embodiment of the present invention. As shown in FIG. 8, the method of this embodiment is the same as that of the second embodiment except the order of the fabricating process. In this embodiment, a buffer layer 212, an amorphous silicon film 214, a heat-retaining capping layer 216, and a patterned mask layer 218 are formed on a substrate 210 in sequence. Then, an excimer laser crystallization process is performed to make the amorphous silicon film 214 melted and crystallize to a polysilicon film. Comparing with the first embodiment mentioned above, the mask layer 218 does not contact with the amorphous silicon film 214 or the formed polysilicon film directly. Thus, the mask layer 218 can use a metal layer without the concern of the metal pollution.

Generally speaking, the present invention utilizes a heat-retaining capping layer to reduce the heat dissipation after the excimer laser irradiation is stopped. Thus, the grains can be grown in an environment with a relative high temperature, leading to increase the grain size. With the assistance of the long pulse duration laser, the present invention can increase the grain size to about 10 μm, which improves the quality of the latter formed low temperature polysilicon thin film transistors. In addition, in the case of forming the heat-retaining capping layer before the mask layer, which is disclosed in the second embodiment of the present invention, since the mask layer does not contact with the amorphous silicon film or the polysilicon film directly, no pollution is concerned while the mask layer is mainly composed of a metal layer.

In contrast with the prior art method, the present invention can not only control the location of the grain boundary, but also improve the grain size in the polysilicon film effectively by using the heat-retaining capping layer and the long pulse duration laser, leading to enhance the electric performance of the low temperature polysilicon thin film transistor and improve the display quality of the display device in advance. In addition, since the heat-retaining capping layer can be disposed between the amorphous silicon film and the mask layer, the conventional problem such as metal pollution or semiconductor film peeling problem can be prevented so as to increase the electric performance and the reliability of the devices.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating a polysilicon film by an excimer laser crystallization process, the method comprising following steps:
   providing a substrate defined with a first region and a second region;
   forming an amorphous silicon film on the substrate;
   forming a mask layer on the amorphous silicon film;
   performing a first photo-etching process to remove the mask layer in the first region;
   forming a heat-retaining capping layer covering the mask layer in the second region and the amorphous silicon film in the fist region; and
   performing the excimer laser crystallization process to make the amorphous silicon film, covered by the heat-retaining capping layer, in the first region crystallize to a polysilicon film, using an excimer laser to irradiate the amorphous film to make the amorphous silicon film in the second region, which is covered with the mask layer, become partially melted and make the amorphous film in the first region, which is not covered with the mask layer, become completely melted, and grains are grown laterally toward the first region from the interface between the first region and the second region.

2. The method of claim 1 wherein the method further comprises an etching process to remove the heat-retaining capping layer after forming the polysilicon film.

3. The method of claim 1 wherein the mask layer comprises a silicon oxide layer, a silicon nitride layer, a metal layer, or a silicon-oxy nitride layer.

4. The method of claim 1 wherein the mask layer is a multi-layer structure.

5. The method of claim 1 wherein the heat-retaining capping layer comprises a silicon oxide layer, a silicon nitride layer, a metal layer, or a silicon-oxy nitride.

6. The method of claim 1 wherein the heat-retaining capping layer is used to decrease the heat dissipating rate of the amorphous silicon film for increasing the size of the grains formed in the excimer laser crystallization process.

7. The method of claim 1 wherein when performing the excimer laser crystallization, the amorphous silicon film in the first region is not directly exposed under the excimer laser because the amorphous silicon film in the first region is covered by the heat-retaining capping layer.

8. The method of claim 1 wherein the heat-retaining capping layer is used to reduce a heat dissipation rate in the crystallization process and maintain the amorphous silicon film in the first region in a higher temperature environment when performing the excimer laser crystallization for increasing grain sizes of the polysilicon film effectively.

9. The method of claim 1 wherein the substrate comprises a buffer layer and the amorphous film is formed on the buffer layer.

10. The method of claim 1 wherein the excimer laser crystallization process is performed with an excimer laser comprising a long duration laser.

11. The method of claim 2 wherein the method further comprises a second photo-etching process to remove the heat-retaining capping layer, the mask layer, and the amorphous silicon film on the buffer layer in the second region after forming the polysilicon film.

12. The method of claim 10 wherein the long duration laser has a period in a range of about 150 to 250 ns.

13. A method of fabricating a polysilicon film by an excimer laser crystallization process, the method comprising following steps:
    providing a substrate defined with a first region and a second region;
    forming an amorphous silicon film on the substrate;
    forming a heat-retaining capping layer covering the amorphous silicon film in both of the first region and the second region;
    forming a mask layer on the heat-retaining capping layer;
    performing a first photo-etching process to remove the mask layer in the first region and expose the heat-retaining capping layer in the first region; and
    performing the excimer laser crystallization process to make the amorphous silicon film, covered by the heat-retaining capping layer, in the first region crystallize to a polysilicon film, using an excimer laser to irradiate the amorphous film to make the amorphous silicon film in the second region, which is covered with the mask layer, become partially melted and make the amorphous film in the first region, which is not covered with the mask layer, become completely melted, and grains are grown laterally toward the first region from the interface between the first region and the second region.

14. The method of claim 13 wherein the method further comprises an etching process to remove the heat-retaining capping layer after forming the polysilicon film.

15. The method of claim 13 wherein the mask layer comprises a silicon oxide layer, a silicon nitride layer, a metal layer, or a silicon-oxy nitride layer.

16. The method of claim 13 wherein the mask layer is a multi-layer structure.

17. The method of claim 13 wherein the heat-retaining capping layer comprises a silicon oxide layer, a silicon nitride layer, or a silicon-oxy nitride layer.

18. The method of claim 13 wherein the heat-retaining capping layer is used to decrease the heat dissipating rate of the amorphous silicon film for increasing the size of the grains formed in the excimer laser crystallization process.

19. The method of claim 13 wherein when performing the excimer laser crystallization, the amorphous silicon film in the first region is not directly exposed under the excimer laser because the amorphous silicon film in the first region is covered by the heat-retain capping layer.

20. The method of claim 13 wherein the heat-retaining capping layer is used to reduce a heat dissipation rate in the crystallization process and maintain the amorphous silicon film in the first region in a higher temperature environment when performing the excimer laser crystallization for increasing grain sizes of the polysilicon film effectively.

21. The method of claim 13 wherein the substrate comprises a buffer layer and the amorphous silicon film is formed on the buffer layer.

22. The method of claim 13 wherein the excimer laser crystallization process is performed with an excimer laser comprising a long duration laser.

23. The method of claim 21 wherein the method further comprises a second photo-etching process after forming the polysilicon film to remove the heat-retaining capping layer, the mask layer, and the amorphous silicon layer on the butler layer after forming the polysilicon film.

24. The method of claim 22 wherein the long duration laser has a period in a range of about 150 to 250 ns.

* * * * *